United States Patent
Kohli et al.

(10) Patent No.: US 7,897,496 B2
(45) Date of Patent: Mar. 1, 2011

(54) SEMICONDUCTOR DOPING WITH REDUCED GATE EDGE DIODE LEAKAGE

(75) Inventors: Puneet Kohli, Austin, TX (US); Nandakumar Mahalingam, Dallas, TX (US); Manoj Mehrotra, Plano, TX (US); Song Zhao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 417 days.

(21) Appl. No.: 11/941,129

(22) Filed: Nov. 16, 2007

(65) Prior Publication Data

US 2009/0127620 A1 May 21, 2009

(51) Int. Cl.
*H01L 21/425* (2006.01)

(52) U.S. Cl. ...................... 438/528; 438/514
(58) Field of Classification Search .............. 438/510, 438/511, 530, 542, 514, 528
See application file for complete search history.

(56) References Cited

U.S. PATENT DOCUMENTS 6,043,139 A * 3/2000 Eaglesham et al. .......... 438/495

2009/0286367 A1 * 11/2009 Krull et al. .................. 438/221

* cited by examiner

*Primary Examiner*—Bradley K Smith
(74) *Attorney, Agent, or Firm*—Jacqueline J. Garner; Wade J. Brady, III; Frederick J. Telecky, Jr.

(57) ABSTRACT

Semiconductor doping techniques, along with related methods and structures, are disclosed that produce components having a more tightly controlled source and drain extension region dopant profiles without significantly inducing gate edge diode leakage. The technique follows the discovery that carbon, which may be used as a diffusion suppressant for dopants such as boron, may produce a gate edge diode leakage if present in significant quantities in the source and drain extension regions. As an alternative to placing carbon in the source and drain extension regions, carbon may be placed in the source and drain regions, and the thermal anneal used to activate the dopant may be relied upon to diffuse a small concentration of the carbon into the source and drain extension regions, thereby suppressing dopant diffusion in these regions without significantly inducing gate edge diode leakage. The increased concentration of carbon in the source and drain regions may permit heavier doping of the source/drain region, leading to improved gate capacitance.

17 Claims, 4 Drawing Sheets

SEMICONDUCTOR DOPING WITH REDUCED GATE EDGE DIODE LEAKAGE

FIELD

This disclosure relates generally to the field of semiconductor fabrication, and more particularly to the placement of dopants in a semiconductor body in a manner providing various advantages.

BACKGROUND

This disclosure relates generally to the field of semiconductor fabrication. In conventional practice, semiconductor fabrication begins with the provision of a semiconductor wafer, comprising silicon formed in a regular, crystalline structure. A circuit pattern is devised in which regions of the semiconductor wafer are intended to support one or more semiconductor components. Each region is doped with a type of dopant opposite the electronic nature of the components to be created thereupon. The formation of the electronic components then occurs upon this semiconductor wafer, and typically involves doping the electronically active areas of the semiconductor wafer with the desired type of dopant. As one example, a semiconductor component may be devised by doping a source region and a drain region, between which resides a channel that is relatively free of the source and drain region dopant, and by subsequently forming a gate over the channel and overlapping a lightly doped portion of the source region and the drain region (known respectively as the source extension region and the drain extension region.) The semiconductor body is exposed to a thermal anneal, which restores the crystalline lattice structure of the semiconductor wafer (since the placement of dopant may have disrupted the crystalline lattice), and also electronically "activates" the dopant ions by positioning them within the lattice structure. The components may then be connected through a metallization step, in which metal paths are formed to connect the electronically active areas of the components into a fully interconnected circuit.

The thermal anneal that activates the dopant may also cause the dopant to diffuse through the semiconductor body. This diffusion may hinder the precise control of the placement of dopant in the desired areas of the semiconductor body, such as in the source region and the drain region.

SUMMARY

The following presents a simplified summary of the disclosure in order to provide a basic understanding of some aspects of the disclosure. This summary is not an extensive overview of the disclosure. It is intended neither to identify key or critical elements of the disclosure nor to delineate the scope of the disclosure. Rather, its primary purpose is merely to present one or more concepts of the disclosure in a simplified form as a prelude to the more detailed description that is presented later.

As noted hereinabove, this disclosure relates to the placement of dopants in a semiconductor body while forming one or more semiconductor components thereupon. The precise placement of dopant is significantly determinative of the electronic properties of the resulting component, such as the performance characteristics. However, the precise placement may be hampered by the thermal anneal, which provides the advantage of electronically activating the dopant, but which also disadvantageously induces the dopant to diffuse out of target regions, such as the source region and the drain region.

The thermally induced diffusion of the dopant from the target regions may be controlled by co-implanting a dopant diffusion suppressant. It has been discovered that carbon is an effective diffusion suppressant for several dopant species, including boron. However, it has also been discovered that carbon placed in the source extension region and the drain extension region may cause gate edge diode leakage, wherein the component exhibits a current flow when the gate is not activated and the component is not intended to be electronically conductive, thereby compromising the intended electronic activity of the component. The degree of gate edge diode leakage may be related to the concentration of carbon present in the source and drain extension regions.

It has further been discovered that the thermal anneal also causes placed carbon to diffuse through the semiconductor body. Therefore, as an alternative to placing carbon in the source extension region and the drain extension region, the carbon may be placed in the source region and the drain region. This placement suppresses the diffusion of dopant in the source region and the drain region. The carbon also diffuses into adjacent areas during the thermal anneal, including the source extension region and the drain extension region. The carbon that diffuses into the source and drain extension regions limits the diffusion of dopant out of the same source and drain extension regions during the thermal anneal. Moreover, the amount of carbon that diffuses into the source/drain extension regions may be kept low in order to suppress the gate edge diode leakage, e.g., by controlling the concentration of carbon implanted in the source/drain regions. In this manner, a semiconductor component may be formed that features better control of dopant placement in the source and drain extension regions (due to the diffusion of carbon into the source and drain extension regions during the thermal anneal), while also featuring a reduced gate edge diode leakage. As an additional and optional advantage, the concentration of dopant in the source region and the drain region may afford a higher dopant concentration in the source and drain regions by suppressing diffusion of the dopant out of these regions, and/or by facilitating heavier doping while abrogating the concern of increased dopant diffusion out of the source region and the drain region. The higher resulting dopant concentration in the source region and the drain region may produce a semiconductor component having a higher gate capacitance.

To the accomplishment of the foregoing and related ends, the following description and annexed drawings set forth in detail certain illustrative aspects and implementations of the disclosure. These are indicative of but a few of the various ways in which one or more aspects of this disclosure may be employed. Other aspects, advantages, and novel features of the disclosure will become apparent from the following detailed description of the disclosure when considered in conjunction with the annexed drawings.

DETAILED DESCRIPTION

Figure 1A:
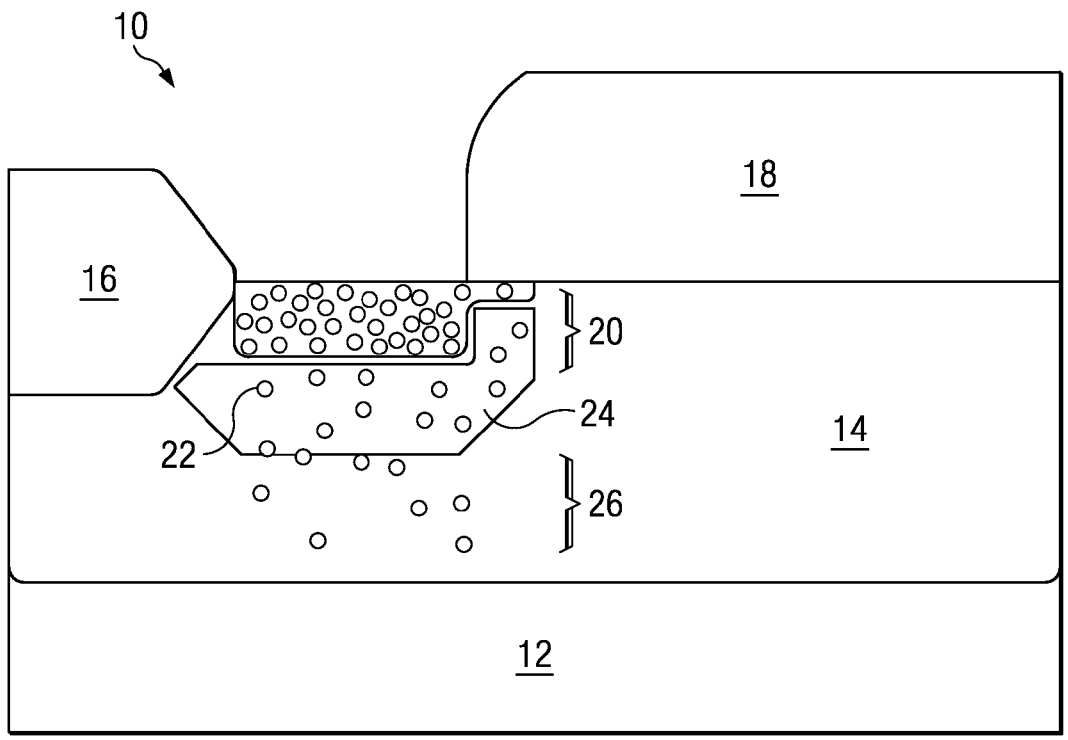
FIGS. 1A-1B are side elevation views in section of a portion of a semiconductor component formed in a semiconductor body.

One or more aspects of this disclosure are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of this disclosure. It may be evident, however, to one skilled in the art that one or more aspects of this disclosure may be practiced with a lesser degree of these specific details. In other instances, well-known structures and devices are shown in block diagram form in order to facilitate describing one or more aspects of this disclosure.

Figure 1B:
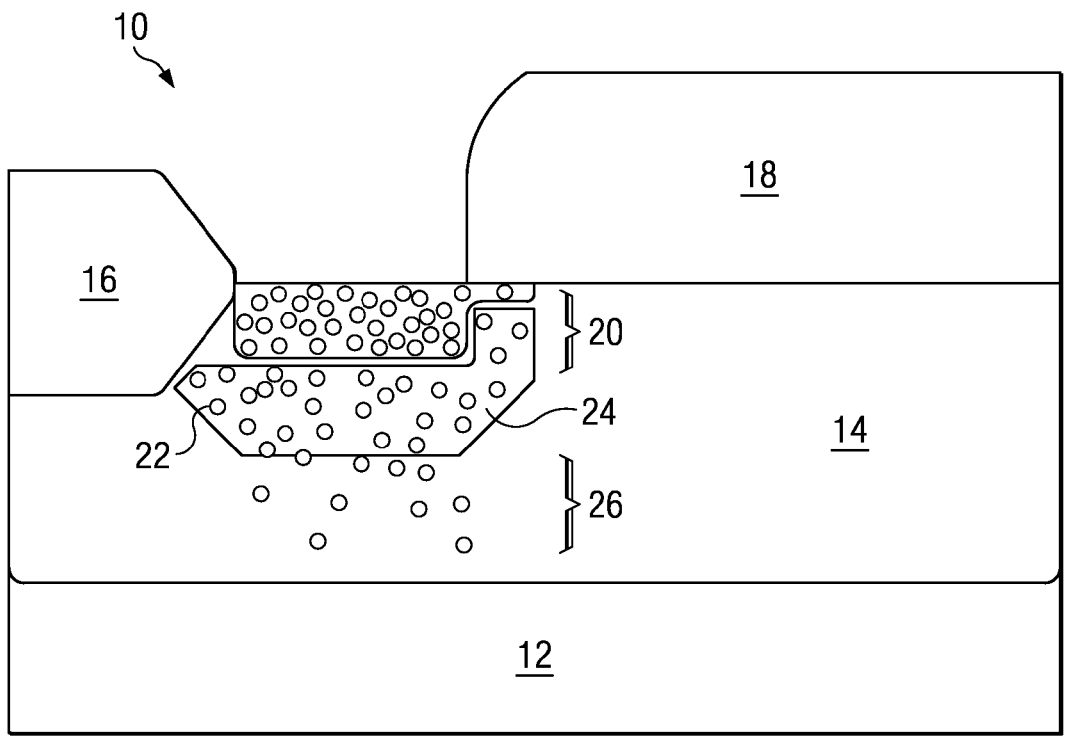

As discussed hereinabove, this disclosure pertains to the placement of a dopant in a region of a semiconductor body (herein referred to generally as a "target region"), and its diffusion out of the target region during the thermal anneal used to activate the dopant. The thermal diffusion suppressant effect may be illustrated by reference to the figures of this disclosure. FIGS. 1A-1B illustrate a typical dopant profile before and after (respectively) the thermal annealing, and without the invocation of the techniques disclosed herein. In these figures, the semiconductor component 10 is illustrated comprising (in part) a silicon wafer 12 where a semiconductor device, such as a MOS transistor, is intended to be formed on the upper layer that will serve as the semiconductor body 14. The semiconductor body is often doped with the opposite type of dopant in order to provide electronic isolation of the components thereupon; however, other arrangements may also be suitable, such as when the substrate hosts an electronically active "pocket" region having the same electronic property but an increased dopant concentration. The electronically active region of the semiconductor body 14 may be isolated from other areas of the semiconductor by the use of an isolation structure 16, such as a localized oxidation of silicon (LOCOS) isolation structure or an isolation trench. These figures illustrate a portion of a transistor, where a gate 18 connects a target area 20 with another active area (not shown.)

In the component partially illustrated in FIGS. 1A-B, the target area 20 is intended to function as an active area of the transistor, e.g., the source or drain region, and is rendered conductive by placing a dopant 22 in the target area 20 and activating it. It will be appreciated that the placement of dopant is significantly determinative of the electronic characteristics of the device, and that precise control over the placement of the dopant 22 in the semiconductor body 14 is valued and helpful. However, as illustrated in FIG. 1A, even before the semiconductor is thermally annealed, some dopant 22 may appear in regions of the semiconductor body 14 below the target area 20. This deeper implantation of the dopant 22 may be caused (in whole or in part) by channeling, an effect related to a physical characteristic of the semiconductor body that causes problems with ion implantation placement. Because the substrate comprises a crystalline lattice with a regular structure, some lattice configurations may include longitudinal channels. If a dopant particle 22 placed via ion implantation is fired at the semiconductor body 14 with an angle and position corresponding to a channel, the dopant particle 22 may deeply penetrate the semiconductor body 14 before coming to rest in a region of the lattice. This channelling results in some undesirably deep penetration, such as in regions 24 and 26 of the semiconductor body 14.

The precise placement of the dopant 22 in the target area 20 is further hampered by diffusion of the dopant 22 out of the target area 20 induced by the thermal anneal. In the post-anneal component portion illustrated in FIG. 1B, the target area 20 contains a high concentration of dopant, but the dopant 22 has diffused out of the target region 20 both laterally and longitudinally into the surrounding area 24 of the semiconductor body 14. Additionally, due to channeling through the substrate lattice, the dopant 22 has deeply penetrated the target area 20 not only at a medium depth such as within the diffusion area 24, and also into a deeper area 26 of the semiconductor body 14. As used herein, an area 20 of the semiconductor 10 where the dopant 22 is intended to be placed will be described as a "target area"; an area 24 where diffusion occurs will be described as a "diffusion area"; and an area 26 where placement occurs at a relatively great depth due to channeling in an ion implantation placement will be describe as a "channeling area."

Figure 2A:
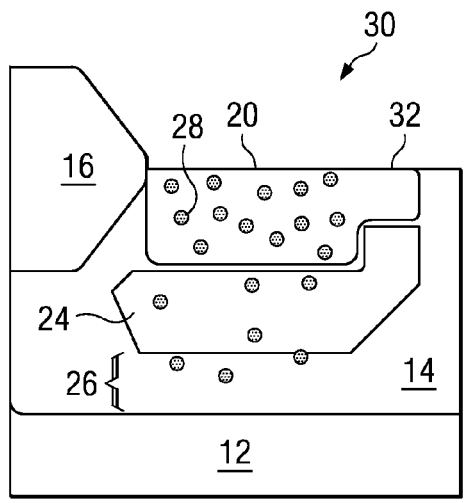
FIGS. 2A-2D are side elevation views in section of a portion of a semiconductor body.
Figure 2B:
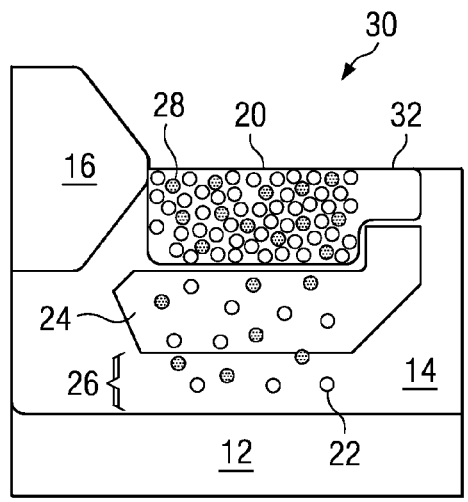
Figure 2C:
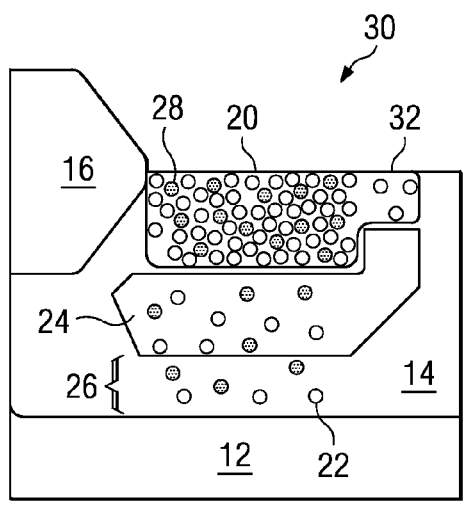

This disclosure presents techniques that may be used to alleviate the problems of channeling and thermally induced diffusion that hamper the precise placement of dopant in the semiconductor body. These techniques may be better understood with reference to FIGS. 2A-2D, which together illustrate a semiconductor body 30 featuring improved dopant placement precision according to the techniques presented herein. In FIG. 2A, carbon 28 is placed in the semiconductor body 14 to serve as a dopant diffusion suppressant. The target region of the semiconductor body 14 comprises a target region 20 (e.g., a target source region, or a target drain region) having an adjacent target extension region 32. Carbon 28 is implanted into the target region 20, and is not implanted in the target extension region 32. This selective implantation may be performed, e.g., by selectively masking the target extension region 32 while implanting the carbon in the target region 20. This masking may be performed by forming a masking structure over the target extension region 32, such as a sacrificial sidewall spacer, prior to the implantation of carbon in the target region 20, and by selectively removing the masking structure after the selective placement. The placement technique used in this exemplary drawing is ion implantation, which, as discussed hereinabove, causes a small amount of carbon to be placed more deeply in the diffusion area 24 and the channeling area 26. In FIG. 2B, the dopant 22 is placed in the target region 20; again, the channeling effect of ion implantation used in this exemplary embodiment causes a small amount of dopant to be placed more deeply in the diffusion area 24 and the channeling area 26. In FIG. 2C, the dopant 22 is also placed in the target region 32. The target extension region 32 is often more lightly doped than the target region 20.

Figure 2D:
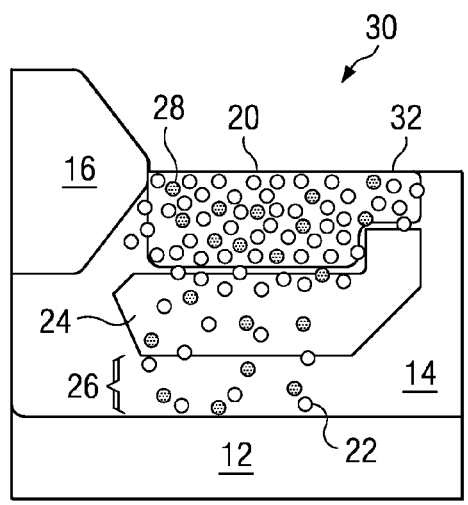

FIG. 2D illustrates the placement of the dopant 22 and carbon 28 after the thermal anneal is performed to activate the dopant 22. As illustrated in FIG. 2D (especially in contrast with FIG. 2C), the dopant 22 and carbon 28 have diffused to a small extent within the target region 20, the target extension region 32, the diffusion area 24, and the channeling area 26.

Two particular advantages of this technique are illustrated in FIG. 2D. First, the diffusion of a small amount of carbon 28 into the target extension region 32 suppresses the diffusion of the dopant 22 out of the target extension region 32, thereby providing tighter process control over the placement of dopant 22 following the thermal anneal. Accordingly, the carbon 28 is placed in the target region 20 with a sufficient concentration to cause some carbon 28 to diffuse into the target extension region 32 and suppress diffusion of the dopant 22. However, as noted above, an excess of carbon 28 present in the target extension region 32 of the formed component may induce an undesirable gate edge diode leakage, so the concentration of carbon 28 must be chosen to limit the diffusion of carbon 28 into the target extension region 32 in order to minimize this undesirable effect.

An optional but additional advantage of this technique is illustrated in FIG. 2D, where the placement of a comparatively high concentration of carbon 28 in the target region 20 provides a comparatively high degree of suppression of dopant diffusion. As a result, a higher concentration of dopant 22 may be placed in the target region 20 with the same quantity of diffused dopant particles out of the target region 20 as compared with a lower concentration of placed dopant 22 and carbon 28; or, the same concentration of dopant 22 may be placed in the target region 20, with a comparatively higher amount of the dopant 22 retained in the target region 20 as compared with a lower concentration of placed dopant 22 and carbon 28. In either scenario, the target region 20 retains a higher concentration of dopant 22, which may produce a semiconductor component 30 having a higher gate capacitance.

An exemplary method is now presented for forming a doped source region having an adjacent doped source extension region and a doped drain region having an adjacent doped drain extension region in a semiconductor body. A better understanding of this exemplary method may be achieved with reference to the flowchart of FIG. 3. The method 40 begins at 42 and involves placing the dopant in the target region 46, and placing the dopant in the target extension region 48. After placements 46 and 48, the method involves thermally annealing the semiconductor body 50. The method also involves placing carbon 44 in the target region prior to the thermal annealing 50 that diffuses into the target extension region during the thermal anneal 50 and suppresses the diffusion of dopant out of the target extension region. Moreover, the carbon is implanted at 44 with a concentration that does not significantly induce gate edge diode leakage in semiconductor components that incorporate the doped regions formed in this manner.

Figure 3:
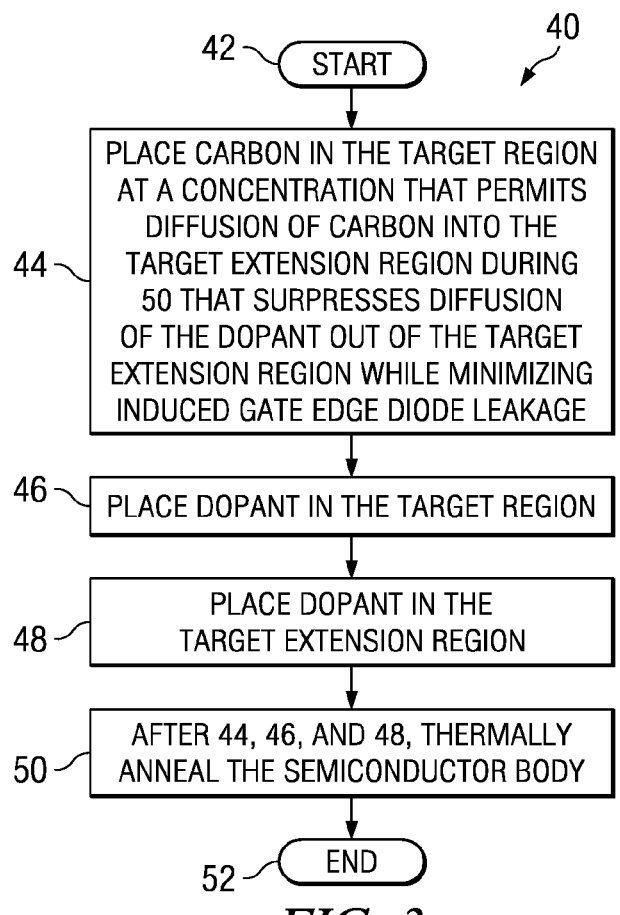
FIG. 3 is a flowchart illustrating a method.

It will be appreciated that the method 40 illustrated in FIG. 3 may be carried out in many variations while remaining in accordance with this disclosure. As one example, the placements 44, 46, and 48 might be carried out in any order; for instance, the dopant may be placed in the target region 46 either before or after being placed in the target extension region 48. The placements might also be performed simultaneously (e.g., two implantations occurring at the same time), or together (e.g., one implantation implanting both the carbon and the dopant, such as in one ion beam.) Other elements might be added with the elements illustrated in FIG. 3 to add advantages or avoid disadvantages, and some such additional elements will be discussed herein.

The method 40 illustrated in FIG. 3 may be implemented in many ways, and may be carried out by semiconductor fabrication systems (e.g., ion implantation systems) configured according to many sets of operating parameters. As one example, boron may be selected as the dopant for creating a p-type semiconductor component. As another example, the carbon may be placed in the target region by ion implantation at approximately 6 keV and at a dosage of approximately $5 \times 10^{14}$ atoms/cm$^2$. As still another example, the dopant (e.g., boron) may be placed in the target region by ion implantation at approximately 3 keV and at a dosage of approximately $3 \times 10^{15}$ atoms/cm$^2$. As still another example, the dopant may be placed in the target extension region by ion implantation at approximately 1 keV and at a dosage of approximately $2 \times 10^{15}$ atoms/cm$^2$. As still another example, the disclosure may be used to create a semiconductor body comprising a doped region having an adjacent doped extension region, where the semiconductor body is formed in accordance with the methods described herein.

As still another example, a method may be devised in accordance with this technique for forming a semiconductor component having a doped source region (with an adjacent doped source extension region) and a doped drain region (with an adjacent doped extension region.) This semiconductor component may be formed by following the method illustrated in FIG. 3 with respect to both a target source region (having an adjacent target source extension region) and a target drain region (having an adjacent target drain extension region), and by additionally (following the placements of 44, 46, and 48) forming a gate in the semiconductor body spanning the target source extension region and the target drain extension region. When the carbon is placed in 44 with a concentration that causes carbon diffusion into the target source extension region and the target drain extension region and suppresses diffusion of the dopant placed therein, while also limiting carbon diffusion so that gate edge diode leakage is not significantly induced in the fully formed semiconductor component, the method may be used to form a semiconductor component having both advantages. This method may also incorporate the various embodiments and alternatives disclosed herein (e.g., incorporating boron as the dopant to form a p-type component.)

Figure 4:
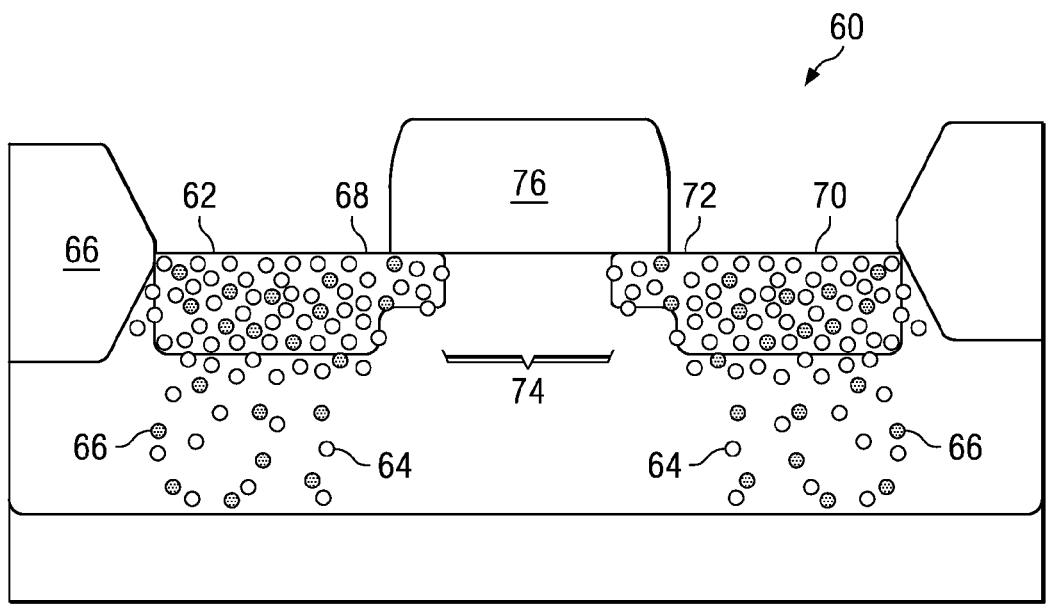
FIG. 4 is a side elevation view in section of another semiconductor component formed in a semiconductor body.

As still another example, the techniques discussed herein may be used to form a semiconductor component in a semiconductor body having at least one doped region. An exemplary semiconductor component formed in this manner is illustrated in FIG. 4. The semiconductor component 60 comprises a source region 62, in which are placed the dopant 64 and carbon 66, and a source extension region 68 adjacent to the source region 62, comprising the dopant 64 at a lower concentration than the dopant 64 of the source region 62, and carbon 66 at a concentration that does not significantly induce gate edge diode leakage in the formed component 60. The semiconductor component 60 also comprises a drain region 70, in which, similar to the source region 62, are place the dopant 64 and carbon 66, and a drain extension region 72 adjacent to the drain region 70, comprising the dopant 64 at a lower concentration than the dopant 64 of the drain region 70, and carbon 66 at a concentration that does not significantly induce gate edge diode leakage in the formed component 60. The semiconductor component further comprises a gate 76 formed over the semiconductor body and spanning the source extension region 68 and the drain extension region 72.

The semiconductor component 60 further comprises a channel 74, comprising a region of the semiconductor body under the gate 76 and between the source extension region 68 and the drain extension region 72 that is devoid of dopant 64. As discussed herein, the thermal processing of the semiconductor body 60 that is used to activate the dopant 64 also causes diffusion of the dopant 64. It will be appreciated, especially with reference to FIG. 4, that since the channel 74 is defined as a region of the semiconductor body that is devoid of dopant 64, the lateral diffusion of the dopant 64 from the source extension region 68 and the drain extension region 72 serves to reduce the length of the channel 74. It will further be appreciated that the techniques disclosed herein operate to limit the diffusion of dopant 64 from the source extension region 68 and the drain extension region 72, and therefore limit the extent to which the channel 74 is reduced in length during thermal processing.

It will be appreciated that the semiconductor component illustrated in FIG. 4 is one possible product of the methods described above. Specifically, the techniques discussed herein can be used to create the semiconductor component 60 having an extension region 68, 72 adjacent to one or more target regions 62, 70, wherein the extension region 68, 72 comprises the dopant 64 at a lower concentration than the target region 62, 70, and carbon 66 diffused into the extension region 68, 72 from the adjacent target region 62, 70 and having a concentration in the extension region 68, 72 that reduces diffusion of the dopant 64 into the channel 74 without significantly inducing gate edge diode leakage. The suppressed diffusion of the dopant 64 by the carbon 66 serves to limit the extent to which the length of the channel 74 is reduced during the thermal anneal of the semiconductor body. Additionally, as discussed herein, the high concentration of carbon 68 placed in the source region 62 and the drain region 70 may control diffusion of the dopant 64 also placed in the source region 62 and the drain region 70, thereby permitting the placement of a higher concentration of dopant 64 that is retained in these regions during thermal annealing, and thereby producing a semiconductor component 60 having a higher capacitance.

An additional advantage may optionally be achieved through the techniques described herein that addresses the undesirably deep implanting of ions due to the channeling effect. As discussed hereinabove, the configuration of the crystalline lattice of the semiconductor body may give rise to longitudinal channels, and the ion implantation process may inadvertently fire some ions into one of these channels that produces an undesirably deep placement of the ion. This effect may be suppressed by amorphizing the crystalline lattice prior to ion implantation of the dopant species, which involves introducing an amorphizer that disrupts the physical regularity of the lattice. The amorphizer ideally comprises an electronically inert species that does not affect the functionality of the semiconductor components. One such species is germanium, which may be introduced, e.g. by ion implantation, in order to impart an amorphous structure without altering the electronic properties of the circuit. It will be appreciated that persons having ordinary skill in the art may be able to select a wide array of amorphizers that are compatible with these techniques, and to combine them with the concepts presented herein without undue experimentation.

Figure 5A:
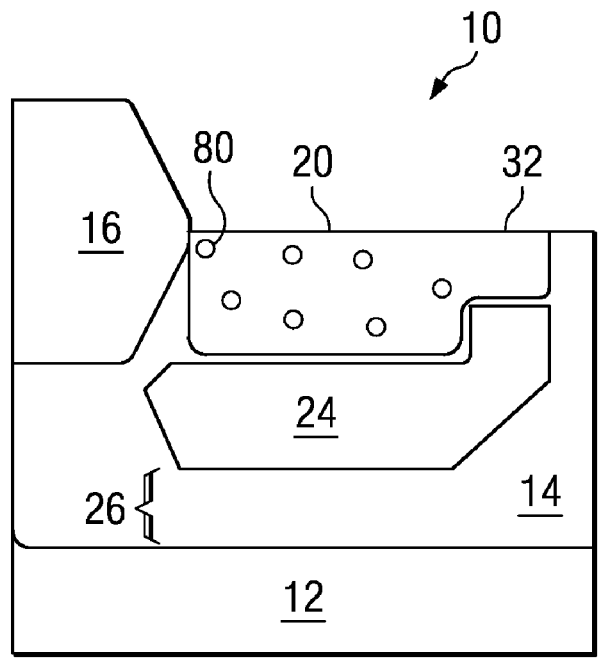
FIGS. 5A-5B are side elevation views in section of a portion of another semiconductor body.
Figure 5B:
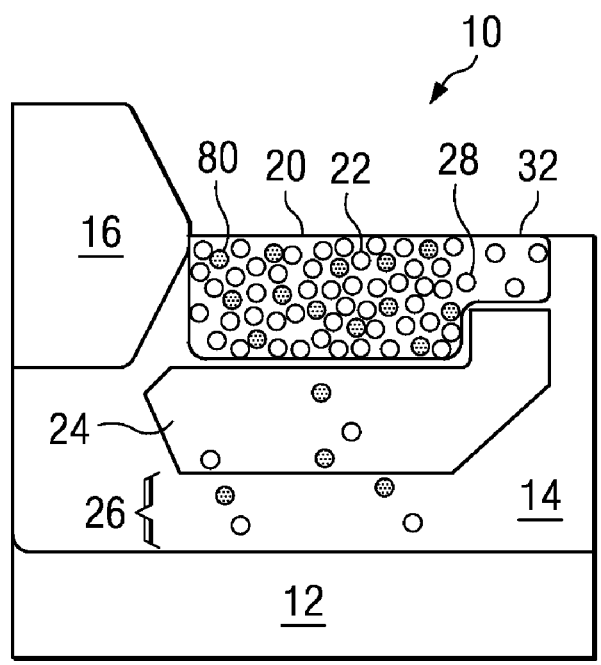

This concept is illustrated in FIG. 5A, an amorphizer 80 may be placed in a target region 20 prior to the ion implantation of the dopant 22 and carbon 28 in the target region 20. The amorphizer 80 may be introduced by any suitable method, e.g., by ion implantation. The introduction of the amorphizer 80 prior to ion implantation of the dopant 22 and carbon 28 produces a doped region 20 such as illustrated in FIG. 5B, in which the dopant 22 and carbon 28 exhibit less deep implantation in the diffusion area 24 and the channeling area 26 as a result of suppressed channeling. The effect may be more fully understood by comparing FIG. 5B with FIG. 2C, in which the dopant 22 and carbon 28 are more commonly implanted deeply without the use of an amorphizer 80.

Accordingly, in a set of embodiments of the techniques described above, the target area 20 is amorphized prior to placing the dopant 22 and carbon 28 by ion implantation. As one example, germanium may be used as an amorphizer 80, and may be placed in the target region 20 and the target extension region 32 prior to placement by ion implantation of the dopant 22 and carbon 28. One such embodiment of this exemplary technique involves the placement of germanium in the target region 20 by ion implantation at 3 keV and at a concentration of $3\times10^{14}$ atoms/cm$^2$. Another such embodiment of this exemplary technique involves the placement of germanium in the target extension region 32 by ion implantation at 20 keV and at a concentration of $5\times10^{14}$ ato Ms/cm$^2$.

It will be appreciated that a wide array of amorphizers may be selected that are compatible with the techniques discussed herein, and may be included in the methods described herein and within the scope of this disclosure.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method of forming a doped region having an adjacent doped extension region in a semiconductor body, the method comprising:
    placing a dopant in a target region;
    placing the dopant in a target extension region adjacent to the target region;
    thermally annealing the semiconductor body after placing the dopant in the target region and the target extension region; and
    placing carbon in the target region and not in the target extension region prior to thermal annealing that diffuses into the target extension region during thermal annealing, wherein the carbon suppresses diffusion of the dopant out of the target extension region.

2. The method of claim 1, the carbon diffusing into the target extension region at a concentration that minimizes induced gate edge diode leakage.

3. The method of claim 1, the dopant comprising boron.

4. The method of claim 1, the carbon placed in the target region by ion implantation at approximately 6 keV at a dosage of approximately $5\times10^{14}$ atoms/cm$^2$.

5. The method of claim 1, the dopant placed in the target region by ion implantation at approximately 3 keV at a dosage of approximately $3\times10^{15}$ atoms/cm$^2$.

6. The method of claim 1, the dopant placed in the target extension region by ion implantation at approximately 1 keV at a dosage of approximately $2\times10^{15}$ atoms/cm$^2$.

7. The method of claim 1, comprising: amorphizing at least one of the target region and the target extension region prior to thermal annealing.

8. The method of claim 7, the amorphizing comprising placing germanium in at least one of the target region and the target extension region.

9. The method of claim 8, the germanium placed in the target region by ion implantation at approximately 3 keV at a dosage of approximately $3\times10^{15}$ atoms/cm$^2$.

10. The method of claim 8, the germanium placed in the target extension region by ion implantation at approximately 20 keV at a dosage of approximately $5\times10^{14}$ atoms/cm$^2$.

11. A semiconductor body having the doped region formed by the method of claim 1.

12. A method of forming a semiconductor component comprising a doped region having an adjacent doped extension region in a semiconductor body, the method comprising:
    placing a dopant in a target region;
    placing the dopant in a target extension region adjacent to the target region;
    thermally annealing the semiconductor body after placing the dopant in the target region and the target extension region;
    forming a gate over the target extension region after placing the dopant in the target region and the target extension region; and
    placing carbon in the target region prior to thermal annealing and prior to forming the gate that diffuses into the target extension region during the thermal anneal, wherein the carbon suppresses diffusion of the dopant out of the target extension region.

13. The method of claim 12, the carbon diffusing into the target extension region at a concentration that minimizes induced gate edge diode leakage.

14. The method of claim 12, the dopant comprising boron.

15. The method of claim 12, comprising: amorphizing at least one of the target region and the target extension region prior to thermal annealing.

16. The method of claim 15, the amorphizing comprising placing germanium in at least one of the target region and the target extension region.

17. The semiconductor component formed according to the method of claim 12.

\* \* \* \* \*